(12) United States Patent
Takahashi et al.

(10) Patent No.: US 6,346,298 B1
(45) Date of Patent: *Feb. 12, 2002

(54) FLEXIBLE BOARD

(75) Inventors: Satoshi Takahashi; Hidetsugu Namiki, both of Kanuma (JP)

(73) Assignee: Sony Chemicals Corp., Tokyo (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/456,440

(22) Filed: Dec. 8, 1999

(30) Foreign Application Priority Data

Dec. 21, 1998 (JP) .............................. 10-363536

(51) Int. Cl.⁷ .............................. B05D 1/38; B05D 3/02
(52) U.S. Cl. .................... 427/409; 427/96; 428/458; 428/473.5
(58) Field of Search .................. 428/209, 213, 428/458, 473.5, 901; 427/96, 409

(56) References Cited

FOREIGN PATENT DOCUMENTS

| JP | 49-98897 | 7/1974 |
|---|---|---|
| JP | A-57-14622 | 1/1982 |
| JP | A-60-157286 | 8/1985 |
| JP | A-60-243120 | 12/1985 |
| JP | A-63-199239 | 8/1988 |
| JP | A-63-239998 | 10/1988 |
| JP | A-1-245586 | 9/1989 |
| JP | 1-245586 | 9/1989 |
| JP | A-3-123093 | 5/1991 |
| JP | A-5-139027 | 6/1993 |
| JP | B2-2746555 | 2/1998 |
| WO | WO98/08216 | * 2/1998 |

* cited by examiner

*Primary Examiner*—D. S. Nakarani
(74) *Attorney, Agent, or Firm*—Oliff & Berridge, PLC

(57) ABSTRACT

A flexible board comprises metal foil 1 and provided thereon a laminated polyimide-based resin layer 2 of a three-layer structure comprising a first polyimide-based resin layer 2a, a second polyimide-based resin layer 2b, and a third polyimide-based resin layer 2c, wherein the following equation is satisfied.

$$k_1 > k_3 > k_2,$$

where $k_1$ is the coefficient of linear thermal expansion of the first polyimide-based resin layer 2a on the side of the metal foil 1, $k_2$ is the coefficient of linear thermal expansion of the second polyimide-based resin layer 2b, and $k_3$ is the coefficient of linear thermal expansion of the third polyimide-based resin layer 2c.

5 Claims, 1 Drawing Sheet

FLEXIBLE BOARD

BACKGROUND OF THE INVENTION

1. Field of the Invention

The present invention relates to a flexible board obtained by forming a polyimide insulating layer of a three-layer structure on metal foil.

2. Related Art of the Invention

Products as obtained by pasting a single-layer polyimide film (insulating layer) to copper foil by thermocompression bonding with the aid of adhesives (for example, epoxy-based adhesives or urethane-based adhesives) are widely used as typical single-sided flexible boards.

Since copper foil and polyimide films are not the same in terms of their coefficients of linear thermal expansion, cooling such single-sided flexible boards following thermocompression bonding sometimes causes curling, twisting, warping, or the like.

In view of this, it has been proposed (Japanese Patent No. 2746555) to use flexible printed boards (copper-clad products) in which curling is suppressed by using a laminated polyimide-based insulating layer having a three-layer structure. These flexible printed boards have laminated polyimide-based resin layers whose three-layer structure on a copper foil used as a conductor comprises a first polyimide-based resin layer that has a coefficient of linear thermal expansion of $20 \times 10^{-6}$ /K or greater and that is formed by means of coating on the copper foil side, a second polyimide-based resin layer that has a coefficient linear thermal expansion of less than $20 \times 10^{-6}$ /K and that is formed by means of coating in the same manner on the first layer, and a third polyimide-based resin layer that has a coefficient of linear thermal expansion of $20 \times 10^{-6}$ /K or greater and that is further formed by means of coating on the second layer. Here, the specific relation among the coefficients of linear thermal expansion of the first polyimide-based resin layer (coefficient of linear thermal expansion: $k_1$), second polyimide-based resin layer (coefficient of linear thermal expansion: $k_2$), and third polyimide-based resin layer (coefficient of linear thermal expansion: $k_3$) is expressed as $k_3 \geq k_1 > k_2$, as shown in Table 1 below (see Working Examples 8 to 12 and Table 2 in Japanese Patent No.2746555). In addition, the coefficient of linear thermal expansion ($k_0$) of a laminated film (substantially corresponds to a laminated polyimide-based resin film having a three-layer structure) following conductor etching is $11 \times 10^{-6}$ /K.

TABLE 1

| Copper-clad products | Coefficient of linear thermal expansion ($\times 10^{-6}$ /K) | | | Laminated film |
|---|---|---|---|---|
| | Polyimide-based resin layers | | | Following conductor |
| Working Example | First | Second | Third | etching |
| 8 | 55 | 13 | 55 | 11 |
| 9 | 55 | 13 | 73 | 11 |
| 10 | 55 | 13 | 60 | 11 |
| 11 | 55 | 13 | 70 | 11 |
| 12 | 55 | 10 | 55 | 9 |

The flexible printed board described in Japanese Patent 2746555, however, has a large difference in the coefficient of linear thermal expansion (8 to $11 \times 10^{-6}$ /K) between the electrolytic copper foil (coefficient of linear thermal expansion following polyimidation heat treatment: about $19 \times 10^{-6}$ /K) and the laminated polyimide-based resin layer coefficient of linear thermal expansion: about 9 to $11 \times 10^{-6}$ /K), so the board undergoes substantial curling, twisting, or warping following copper foil etching when the flexible printed board is cooled to room temperature and allowed to shrink following imidation heat treatment. In addition, the coefficient of linear thermal expansion of copper foil is greater than the coefficient of linear thermal expansion of the laminated polyimide-based resin layer, so the board contracts and curls such that a convexity is formed on the laminated polyimide-based resin layer side. Furthermore, the coefficient of linear thermal expansion of the third polyimide-based resin layer is equal to or greater than the coefficient of linear thermal expansion of the first polyimide-based resin layer, so the curling of the entire laminated polyimide-based resin layer fails to produce a convexity on the copper foil side despite the fact that the presence of a convex curl on the copper foil side is preferred, taking into account the lamination of a cover layer on a circuit pattern following the formation and treatment of this circuit pattern.

Thus, a resulting drawback is that when curling occurs in such a way that a convexity forms on the laminated polyimide-based resin layer side of the flexible printed board, it is difficult to hold the board by vacuum chucking (with the copper foil side facing up) in order to pattern the copper foil, and when the board is transported along a line, the ends of the board curl up and become caught or otherwise damaged in a transporting device during transport.

SUMMARY OF THE INVENTION

An object of the present invention is to overcome the above-described drawbacks of the prior art and to provide a flexible board obtained by forming a laminated polyimide-based resin layer having a three-layer structure and serving as an insulating layer on metal foil, wherein this flexible board is configured such that the curling is absent or is negligibly small following metal foil patterning or imidation heat treatment, and that a convexity is formed on the metal foil side when slight curling does occur.

The present inventors perfected the present invention upon discovering that the stated object can be attained by arranging each of the polyimide-based resin layers constituting a laminated polyimide-based resin layer of a three-layer structure in the following descending order of coefficients of linear thermal expansion: the polyimide-based resin layer on the metal foil side, the polyimide-based resin layer on the side opposite the metal foil, and the polyimide-based resin layer sandwiched therebetween.

Specifically, the present invention provides a flexible board, comprising a metal foil and provided thereon a laminated polyimide-based resin layer of a three-layer structure comprising a first polyimide-based resin layer, a second polyimide-based resin layer, and a third polyimide-based resin layer, wherein said flexible board satisfies the equation $$k_1 > k_3 > k_2$$

where $k_1$ is the coefficient of linear thermal expansion of the first polyimide-based resin layer on the metal foil side, $k_2$ is the coefficient of linear thermal expansion of the second polyimide-based resin layer, and $k_3$ is the coefficient of linear thermal expansion of the third polyimide-based resin layer.

These and other objects, features and advantages of the present invention are described in or will become apparent from the following detailed description of the invention.

DETAILED DESCRIPTION OF THE INVENTION

The present invention will now be described in detail.

Figure 1:
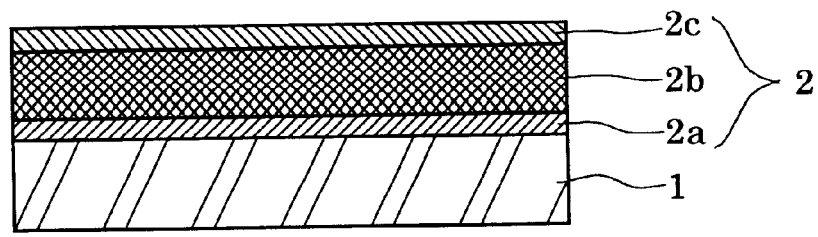
FIG. 1 is a cross section of the flexible board of the present invention.

The flexible board of the present invention is configured such that a laminated polyimide-based resin layer 2 of a three-layer structure comprising a first polyimide-based resin layer 2a on the metal foil side, a second polyimide-based resin layer 2b, and a third polyimide-based resin layer 2c is formed on a metal foil 1, as shown in FIG. 1.

In the present invention, the following equation is satisfied.

$$k_1 > k_3 > k_2$$

where $k_1$ is the coefficient of linear thermal expansion of the first polyimide-based resin layer on the metal foil side, $k_2$ is the coefficient of linear thermal expansion of the second polyimide-based resin layer, and $k_3$ is the coefficient of linear thermal expansion of the third polyimide-based resin layer. If this equation is not satisfied, substantial curling occurs following imidation heat treatment or metal foil patterning, and the resulting curling sometimes fails to form a convexity on the metal foil side. Based on this fact, the first polyimide-based resin layer, second polyimide-based resin layer, and third polyimide-based resin layer will now be described in detail.

In the laminated polyimide-based resin layer 2, an important function of the first polyimide-based resin layer 2a in contact with the metal foil 1 is to bond the laminated polyimide-based resin layer 2 to the metal foil 1. A resin whose coefficient of linear thermal expansion has been increased by the introduction of sulfonic groups or other polar functional groups commonly has lower heat resistance but better adhesion to metal foil than does a resin with a lower coefficient of linear thermal expansion. In the present invention, therefore, the coefficient of linear thermal expansion $k_1$ of the first polyimide-based resin layer 2a is set higher than the coefficient of linear thermal expansion $k_2$ of the second polyimide-based resin layer 2b in order to ensure proper adhesion to the metal foil 1 while allowing the laminated polyimide-based resin layer 2 as a whole to maintain its heat resistance.

The specific coefficient of linear thermal expansion $k_1$ of the first polyimide-based resin layer 2a should be set to $20 \times 10^{-6}$ /K or higher, and preferably 25 to $20 \times 10^{-6}$ /K. The coefficient of linear thermal expansion $k_1$ of the first polyimide-based resin layer 2a can be adjusted by varying the below-described types of starting material components or the mixing rates thereof.

Products obtained by forming films from the below-described varnishes into films and subjecting the films to optional imidation may be used as such first polyimide-based resin layers 2a. These varnishes include polyamic acids obtained from acid dianhydrides and diamines (see Japanese Patent Application Laid-open Nos. SHO60-157286, SHO60-243120, SHO063-239998, HEI1-245586, HEI3-123093, and HEI5-139027); partially imidated polyimide amic acids obtained from diisocyanate compounds and polyamic acid prepolymers, which have terminal acid dianhydrides and which are synthesized from excess acid dianhydrides and diamines (see "Polyamide Resin Handbook," Published by Nikkan Kogyo Shinbunsha, p. 536, 1988); polyamide-imide resins obtained from diisocyanate compounds, diamines, and acid anhydrides (tricarboxylic anhydrides) having free carboxylic acid groups (see "Practical Plastics Dictionary," p. 485, Compiled by Sangyo Chosakai, 1993; Japanese Patent Application Laid-open Nos. SHO49-98897 and SHO57-14622); and soluble polyimide resins (see Japanese Patent Application Laid-open No. SHO63-199239). Of these, a low-acidity polyimide-based resin layer may preferably be used because it prevents the metal foil 1 from becoming corroded. Consequently, a low-acidity polyamic acid imidated film, or a soluble polyimide film or polyamide-imide film devoid of acid groups can be used to advantage. In particular, polyamide-imide resins, which are high-melting thermoplastic resins, are preferred for use because of their ability to relax the stress induced in flexible boards during an imidation heat treatment or other high-temperature heat treatment.

Preferred examples of acid dianhydrides that can be used as the starting materials constituting the first polyimide-based resin layer 2a include pyromellitic dianhydride (PMDA), 3,4,3', 4'-biphenyltetracarboxylic dianhydride (BPDA), 3,4,3', 4'-benzophenonetetracarboxylic dianhydride (BTDA), 3,4,3', 4'-diphenylsulfonetetracarboxylic dianhydride (DSDA), and 3,4,3', 4'-diphenylethertetracarboxylic dianhydride (DEDA).

Preferred examples of tricarboxylic anhydrides include trimellitic anhydride, 3,3', 4'-benzophenonetricarboxylic anhydride, and 2,3,4'-diphenyltricarboxylic anhydride.

Preferred examples of diamines include 4,4'-diaminodiphenyl ether (DPE), paraphenylenediamine (p-PDA), orthophenylenediamine (o-PDA), metaphenylenediamine (m-PDA), 2,4-diaminotoluene (TDA), 3,3'-dimethyl-4,4'-diaminobiphenyl (DMDBP), 4,4'-diaminobenzanilide (DABA), and 4,4'-bis(p-aminophenoxy)diphenyl sulfone (BAPS).

Preferred examples of duisocyanate compounds include 4,4'-diphenylmethane diisocyanate, 2,4-tolylene diisocyanate, tolidine isocyanate, 1,5-naphthalene diisocyanate, xylylene diisocyanate, and hexamethylene diisocyanate.

The second polyimide-based resin layer 2b functions to ensure that the entire laminated polyimide-based resin layer 2 has proper heat resistance and to bring its coefficient close to the coefficient of linear thermal expansion $k_m$ of the metal foil 1. Consequently, the difference between the coefficient of linear thermal expansion $k_2$ of the second polyimide-based resin layer 2b and the coefficient of linear thermal expansion $k_m$ of the metal foil 1 is adjusted preferably to within $\pm 5 \times 10^{-6}$ /K, and more preferably to within $\pm 5 \times 10^{-6}$ /K. The curling of the flexible board can thus be controlled irrespective of the specifics of an ordinary heat history (storage at normal temperature, solder dipping, and the like).

The specific coefficient of linear thermal expansion $k_2$ of the second polyimide-based resin layer 2b may be preferably (10 to 25) $\times 10^{-6}$ /K and more preferably (17 to 23)$\times 10^{-6}$ /K, in view of the fact that the coefficient of linear thermal expansion $k_m$ of an imidation heat-treated metal foil 1 commonly used for the flexible board assumes the numerical values shown in Table 2 below. Similar to the first polyimide-based resin layer 2a, the coefficient of linear thermal expansion $k_2$ of the second polyimide-based resin layer 2b can be adjusted by varying the types of starting material components or the mixing rates thereof.

TABLE 2

| Material | Coefficient of lenear thermal expansion $k_m$ ($\times 10^{10-6}$ /K) | |
|---|---|---|
| | Literature value | Measured value |
| Copper foil | 16 to 20 | 18 to 19 |
| SUS 304 foil | 16 to 17 | 17 to 18 |
| SUS 430 foil | 10 to 11 | — |
| Aluminum foil | 22 to 25 | 22 to 23 |
| Beryllium-copper foil | 17 to 18 | — |
| Phosphor bronze foil | 17 to 18 | — |

Similar to the first polyimide-based resin layer 2a, the second polyimide-based resin layer 2b having the above-described characteristics can be fashioned by forming films of polyamic acids, polyimide amic acids, polyamide-imide acids, soluble imide resins or other varnishes, and optionally imidating these films.

The third polyimide-based resin layer 2c is provided to one side of the second polyimide-based resin layer 2b as a layer whose coefficient of linear thermal expansion compensates for that of the first polyimide-based resin layer 2a in order to control the curling of the laminated polyimide-based resin layer 2 per se when large areas of the metal foil 1 are removed and both sides of the laminated polyimide-based resin layer 2 are exposed during the patterning of the metal foil 1 Consequently, the coefficient of linear thermal expansion $k_3$ of the third polyimide-based resin layer 2c in the present invention is set higher than the coefficient of linear thermal expansion $k_2$ of the second polyimide-based resin layer 2b. It should be noted that the surface roughness imparted to the metal foil and designed to improve adhesion to a polyimide layer acts to form a convexity in the curling direction of the metal foil, that is, causes the first polyimide-based resin layer 2a to form a convexity on the side of the metal foil 1, because shrinkage force acting on the surface along which the metal foil is bonded to the polyimide layer is created by an increase in the adhesion between the metal foil and the polyimide layer when the flexible board is substantially uncurled or forms a slight convexity on the side of the metal foil 1. The coefficient of linear thermal expansion $k_3$ of the third polyimide-based resin layer 2c must be set lower than the coefficient of linear thermal expansion $k_1$ of the first polyimide-based resin layer 2a in order to compensate for such curling. Specifically, the difference $(k_1-k_3)$ between the coefficient of linear thermal expansion $k_1$ of the first polyimide-based resin layer 2a and the coefficient of linear thermal expansion $k_3$ of the third polyimide-based resin layer 2c may be confined preferably to $+5\times10^{-6}$ /K, and more preferably to $+3\times10^{-6}$ /K.

The coefficient of linear thermal expansion $k_0$ of the entire laminated polyimide-based resin layer 2 comprising the above-described first polyimide-based resin layer 2a, second polyimide-based resin layer 2b, and third polyimide-based resin layer 2c may be preferably $(10\ to\ 30)\times10^{-6}$ /K, and more preferably $(17\ to\ 28)\times10^{-6}$ /K. This coefficient is set higher than the coefficient of linear thermal expansion $k_m$ of the metal foil 1 in order to control curling or to form a convexity on the side of the metal foil 1 when slight curling does occur. In this case, the difference $(k_0-k_m)$ between them may be preferably 0 to $+7\times10^{-6}$ /K, and more preferably 0 to $+5\times10^{-6}$ /K.

The thicknesses of the first polyimide-based resin layer 2a, second polyimide-based resin layer 2b, and third polyimide-based resin layer 2c may be set preferably such that the thickness $t_2$ of the second polyimide-based resin layer 2b is greater than the thickness $t_1$ of the first polyimide-based resin layer 2a or the thickness $t_3$ of the third polyimide-based resin layer 2c.

Specifically, the thickness $t_2$ of the second polyimide-based resin layer 2b may be preferably 5 to 100 μm, and more preferably 10 to 50 μm, because an excessively thin layer lowers the mechanical strength of the entire laminated polyimide-based resin layer, whereas an excessively thick layer increases the stiffness of the laminated polyimide-based resin layer per se and makes it impossible to obtain roll-wound articles of prescribed size.

In addition, the thickness $t_1$ of the first polyimide-based resin layer 2a or the thickness $t_3$ of the third polyimide-based resin layer 2c may be preferably 1 to 10 μm, and more preferably 2 to 5 μm, because an excessively thin layer is difficult to form, whereas an excessively thick layer may increase the difference between the coefficient of linear thermal expansion $k_m$ of the metal foil 1 and the coefficient of linear thermal expansion $k_0$ of the entire laminated polyimide-based resin layer 2, which depends on the coefficient of linear thermal expansion k2 of the second polyimide-based resin layer 2b.

In this case, the ratio $t_1/t_3$ of the thickness $t_1$ of the first polyimide-based resin layer 2a and the thickness $t_3$ of the third polyimide-based resin layer 2c may be preferably 0.5 to 2.0, and more preferably 1.0 to 2.0. With the ratio within this range, it is possible to achieve higher efficiency in preventing the flexible board from curling.

A heat-resistant resin other than a polysulfone, an adhesive such as an epoxy adhesive, a rust inhibitor such as a triazole or imidazole, or the like may also be added as needed to the first polyimide-based resin layer 2a, second polyimide-based resin layer 2b, and third polyimide-based resin layer 2c.

As shown in Table 2, SUS 304 foil, SUS 430 foil, aluminum foil, beryllium-copper foil, phosphor bronze foil, or the like may be used as the metal foil 1. The surface of the metal foil 1 may also be subjected to matting, Ni/Zn plating, oxidation, or the like in order to improve adhesion to the laminated polyimide-based resin layer 2.

It is also possible to perform an aluminum alcoholate treatment, aluminum chelate treatment, silane coupling treatment, imidazole treatment, or other chemical treatment.

An example of manufacturing the flexible board of the present invention will now be described with reference to FIGS. 2A to 2D for a case in which the polyimide-based resin layers are composed of polyamic acids.

Figure 2A:
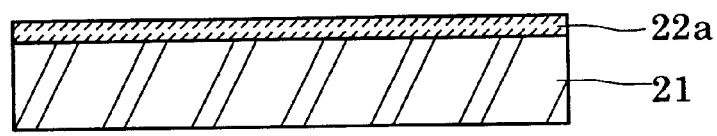
FIGS. 2A to 2D are diagrams illustrating the steps performed in order to manufacture the flexible board of the present invention.

First, a metal foil 21 is coated with a polyamic acid varnish for forming the first polyimide-based resin layer by a comma coater, knife coater, roll coater, lip coater, gravure coater, die coater, or the like, and the coated foil is dried in a continuous drying furnace (arch-type furnace, floating furnace, or the like) to prevent foaming and to bring the content of residual volatile fractions (solvents, condensed water, and the like) to within a range of 20 to 30 wt %, yielding a polyimide precursor film 22a (FIG. 2A). In this case, a volatile fraction content below 20 wt % creates a danger that the adhesion between the first polyimide-based resin layer and second polyimide-based resin layer will be inadequate, while a content in excess of 30 wt % fails to stabilize the coefficient of contraction or the adhesive strength between the first polyimide-based resin layer and second polyimide-based resin layer.

As used herein, the term "content of residual volatile fractions" refers to the weight percentage (wt %) of all the volatile components in the polyimide precursor film.

Examples of solvents that can be used during varnish preparation include N-methyl-2-pyrrolidone, N,N-dimethylacetamide, xylene, toluene, and ethylene glycol monoethyl ether.

Figure 2B:
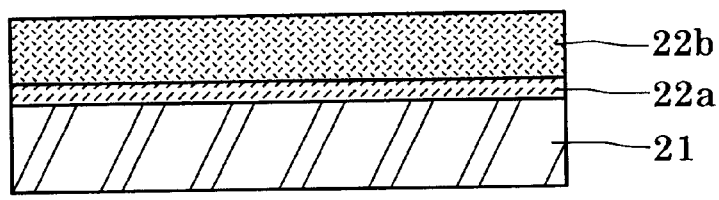

The first polyimide precursor film 22a is subsequently coated in the same manner with a polyamic acid varnish for forming a second polyimide-based resin layer, and the coated film is dried to bring the content of residual volatile fractions to within a range of 30 to 50 wt %, yielding a second polyimide precursor film 22b (FIG. 2B). In this case, it is unsuitable for the content of residual volatile fractions to fall below 30 wt % or to exceed 50 wt % because in the first case there is a danger that the adhesion between the first polyimide-based resin layer and second polyimide-based resin layer will be inadequate, and in the second case foaming occurs during imidation.

Figure 2C:
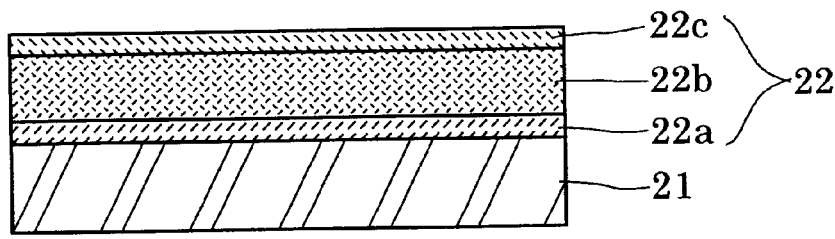

The second polyimide precursor film 22b is subsequently coated in the same manner with a polyamic acid varnish for forming a third polyimide-based resin layer, and the coated film is dried to bring the content of residual volatile fractions to within a range of 30 to 50 wt %, yielding a third polyimide precursor film 22c. A laminated polyimide precursor film 22 having a three-layer structure is thereby obtained (FIG. 2C).

The laminated polyimide precursor film 22 is subsequently imidated. The imidation is carried out by performing a heat treatment in a continuous furnace at a temperature of 210 to 250° C., and preferably 230 to 240° C., to set the content of residual volatile fractions to a level that is preferably 7 to 10%, and to bring the imidation ratio to 50% or lower. (Imidation ratio is a value calculated by IR absorption spectrum analysis (surface reflection technique (ATR technique) on the basis of the absorption of imide groups at an absorption wavelength of 1780 cm$^{-1}$, in relation to the absorption observed when the same sample is 100% imidated.) It is unsuitable in this case for the content of residual volatile fractions to fall below 7% or to exceed 10% because in the first case it is impossible to adequately control curling, and in the second case blocking tends to occur. In addition, an imidation ratio that is greater than 50% makes it impossible to achieve adequate curling control.

It is unsuitable for the heating temperature to fall below 210° C. or to exceed 250° C. because when below 210° C. the content of residual volatile fractions is higher than 7%, and when above 250° C. the imidation ratio is higher than 50%.

Figure 2D:
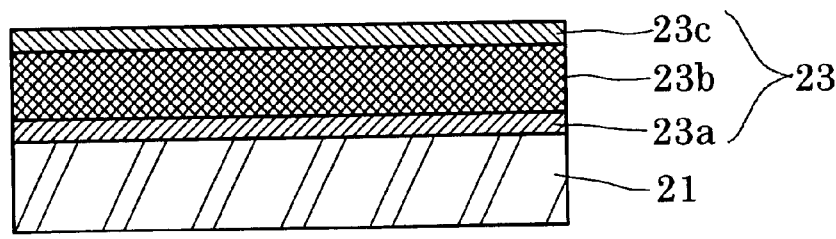

When imidation is completed, the laminated polyimide precursor layer 22 is transformed into a laminated polyimide-based resin layer 23 whose three-layer structure comprises a first polyimide-based resin layer 23a, a second polyimide-based resin layer 23b, and a third polyimide-based resin layer 23c (FIG. 2D). A flexible board of the present invention such as that shown in FIG. 1 is thus obtained.

In the flexible board thus obtained in accordance with the present invention, curling is absent or is negligibly small following metal foil patterning or imidation heat treatment, and a convexity is formed on the metal foil side when slight curling does occur. It is therefore possible to fabricate a flexible wiring board having low curling and excellent dimensional stability (coefficient of contraction), and the mounting of components on the surface thereof is facilitated.

The flexible board of the present invention also has excellent dimensional stability in the crosswise and longitudinal directions because the coefficient of contraction thereof remains stable irrespective of the heat history. Correction values can therefore be kept constant during circuit design, and circuits can be designed with greater ease. In addition, metal foil is easier to pattern, and fine patterning can be readily performed.

The flexible board of the present invention also has adequate roll winding characteristics in relation to curling because the adhesive strength between the metal foil and the laminated polyimide-based resin layer remains stable in the crosswise and longitudinal directions.

EXAMPLES

The present invention will now be described in detail.

Reference Example A1

(Preparation of Polyimide Amic Acid Varnish) 4,4'-Diaminodiphenyl ether (DPE, manufactured by Wakayama Seika), used in an amount of 120 g (0.6 mol), was dissolved in about 2.0 kg of the solvent N-methyl-2-pyrrolidone (NMP, manufactured by Mitsubishi Chemical) under a nitrogen gas atmosphere. Pyromellitic dianhydride (PMDA; 218 g, or 1.0 mol) was then added at 20° C. to the resulting solution, and a reaction was allowed to occur for 1 hour, yielding a solution of a prepolymer in which both ends were acid anhydrides.

2,4-Tolylene diisocyanate (TODI) was subsequently added in an amount of 69.6 g (0.4 mol) to the prepolymer solution, and the system was slowly heated to 60° C. Carbon dioxide bubbles were observed forming at the start of the reaction, and the system thickened. The reaction was continued for another 2 hours while 2.8 kg N-methyl-2-pyrrolidone was added in portions. A viscous polyimide amic acid varnish with a solids content of about 8.5% and a viscosity of 20 Pa·S was obtained as a result (imidation ratio of charge (molar percentage of diisocyanate compound): 40%).

The resulting polyimide amic acid varnish was applied to copper foil, the solvent was vaporized in a 80 to 160° C. continuous furnace, the atmosphere temperature was raised to 230 to 350° C. and an imidation treatment was performed for 10 minutes at 350° C. The copper foil was etched away in a ferric chloride solution, yielding a single-layer polyimide film with a thickness of 25 μm. The coefficient of linear thermal expansion of the resulting polyimide film was 35×10$^{-6}$ /K. A thermomechanical analyzer (TMA/SCC 150CU) manufactured by SII was used at an operating load of 2.5 to 5 g according to a tension technique.

Reference Example A2

(Preparation of Polyimide Amic Acid Varnish)

A viscous polyimide amic acid varnish (imidation ratio of charge (molar percentage of diisocyanate compound): 40%) was obtained by repeating the same procedures as in Reference Example A1 except that 3,4,3',4'-biphenyltetracarboxylic dianhydride (BPDA) was used instead of the PMDA, and 4,4'-diphenylmethane diisocyanate (MDI) was used instead of the TODI.

A single-layer polyimide film was obtained by treating the resulting polyimide amic acid varnish in the same manner as in Reference Example A1. The coefficient of linear thermal expansion of the resulting polyimide film was 48×10$^{-6}$ /K.

The results of Reference Examples A1 and A2 are shown in Table 3.

TABLE 3

| Reference Example | Acid dianhydride (number of moles) | Diamine (number of moles) | Diisocyanate (number of moles) | Coefficient of linear thermal expansion (× 10$^{-6}$ /K |
|---|---|---|---|---|
| A1 | PMDA (1.0) | DPE (0.6) | TODI (0.4) | 30 |
| A2 | BPDA (1.0) | DPE (0.6) | MDI (0.4) | 48 |

Reference Example B1
(Preparation of Polyamide-Imide Resin Varnish)

Trimellitic anhydride (TMA; 192 g, or 1.0 mol), 4,4'-diaminodiphenylmethane (DMA; 158.4 g, or 0.8 mol), and N-methyl-2-pyrrolidone (NMP; 350 g) were added in a single batch to a separable flask, and the system was slowly heated in an oil bath under agitation while dry nitrogen gas was passed in order to rapidly remove formation water. The temperature of the oil bath reached 240° C. one hour later. A reaction was allowed to occur for 4 hours in this state, and the temperature of the oil bath was then lowered to 120° C. 4,4'-Diphenylmethane diisocyanate (MDI; 62.5 g, or 0.25 mol) and N-methyl-2-pyrrolidone (NMP; 1100 g) were subsequently added, the temperature was raised to 195° C. over a period of about 1 hour, and a reaction was allowed to occur at this temperature for 4 hours. A dark-brown polyamide-imide resin varnish with a solids content of about 20% and a viscosity of 30 Pa·S (25° C.) was thus prepared. The (TMA/DMA) molar ratio was 1.25, and the {(TMA+MDI)/DMA} molar ratio was 1.05.

A single-layer polyamide-imide resin film was obtained by treating the resulting polyamide-imide resin varnish in the same manner as in Reference Example A1. The coefficient of linear thermal expansion of the resulting polyamide-imide resin film was $50 \times 10^{-6}$ /K.

Reference Example B2
(Preparation of Polyamide-Imide Resin Varnish)

A viscous polyamide-imide resin varnish was obtained by repeating the same procedures as in Reference Example B1 except that 4,4'-diaminodiphenyl ether (DPE) was used instead of the DMA.

A single-layer polyamide-imide resin film was obtained by treating the resulting polyamide-imide resin in the same manner as in Reference Example A1. The coefficient of linear thermal expansion of the resulting polyamide-imide resin film was $34 \times 10^{-6}$ /K.

The results of Reference Examples B1 and B2 are shown in Table 4.

TABLE 4

| Reference Example | Acid anhydride T (mol) | Diamine A (mol) | Diisocyanate I (mol) | Molar ratio T/A (A + I)/T | Coefficient of linear thermal expansion ($\times 10^{-6}$ /K) |
|---|---|---|---|---|---|
| B1 | TMA | DMA | MDI | 1.25 | 50 |
|  | (1.0) | (0.8) | (0.25) | 1.05 |  |
| B2 | TMA | DPE | MDI | 1.25 | 34 |
|  | (1.0) | (0.8) | (0.25) | 1.05 |  |

Reference Example C1
(Preparation of Polyamic Acid Varnish)

Paraphenylenediamine (PDA, manufactured by Mitsui Chemical) and 4,4'-diaminodiphenyl ether (DPE, manufactured by Wakayama Seika) were dissolved in amounts of 0.150 kg (1.6 mol) and 2.58 kg (14.4 mol), respectively, in about 45 kg of the solvent N-methyl-2-pyrrolidone (NMP, manufactured by Mitsubishi Chemical) under a nitrogen gas atmosphere in a 60-L reaction kettle fitted with a temperature controller and a jacket. Pyromellitic dianhydride (PMDA, manufactured by Mitsubishi Gas Chemical) was then gradually added in an amount of 3.523 kg (16.14 mol) at 50° C., and a reaction was allowed to occur for 3 hours. A polyamic acid varnish with a solids content of about 12% and a viscosity of 25 Pa·S (25° C.) was thus obtained.

A single-layer polyimide resin film was obtained by treating the resulting polyamic acid varnish in the same manner as in Reference Example A1. The coefficient of linear thermal expansion of the resulting polyimide film was $30 \times 10^{-6}$ /K.

Reference Example C2 through C6
(Preparation of Polyamic Acid Varnishes)

Using the starting materials shown in Table 5, polyamic acid varnishes were prepared by repeating the procedures of Reference Example C1.

Single-layer polyimide resin films were obtained by treating the resulting polyamic acid varnishes in the same manner as in Reference Example A1. The coefficients of linear thermal expansion of the resulting polyimide films are shown in Table 5.

TABLE 5

| Reference Example | Acid anhydride T (mol) | Diamine (a) | Diamine (b) | Molar ratio (a)/(b) | Coefficient of linear thermal expansion ($\times 10^{-6}$ /K) |
|---|---|---|---|---|---|
| C1 | PMDA | DPE | DABA | 25/75 | 21 |
| C2 | PMDA | DPE | DABA | 60/40 | 29 |
| C3 | PMDA | DPE | PDA | 75/25 | 40 |
| C4 | PMDA | DPE | PDA | 30/70 | 22 |
| C5 | BPDA | DPE | PDA | 80/20 | 46 |
| C6 | BPDA | DPE | PDA | 20/80 | 23 |

Working Examples 1 through 7 and Comparative Examples 1 through 3
(Manufacture of Flexible Boards)

Table 6 shows the metal foil used in the working and comparative examples. The metal foil articles used were subjected to the imidation treatment described below, and the coefficients of linear thermal expansion thereof were measured. The results are shown in Table 6.

TABLE 6

| Metal foil | Coefficient of linear thermal expansion following imidation treatment |
|---|---|
| Cu foil (electrolytic copper foil of 18 μm thickness; CF-T9-LP, manufactured by Fukuda Kinzoku) | $19.0 \times 10^{-6}$ /K |
| SUS foil (stainless steel foil of 25 μm thickness; SUS 304, manufactured by Nippon Steel Corp.) | $17.5 \times 10^{-6}$ /K |
| Al foil (aluminum foil of 25 μm thickness, manufactured by Nippon Foil Mfg.) | $24.0 \times 10^{-6}$ /K |

The metal foil (width: 540 mm) shown in Table 6 was coated to an intended dry film thickness with a varnish (polyimide amic acid varnish, polyamide-imide resin varnish, or polyamic acid varnish) shown in Table 7 and designed for the first polyimide-based resin layer, and the coated foil was dried at a temperature of 80 to 170° C. using a floating furnace, yielding a first polyimide-based resin precursor film.

The content of residual volatile fractions in the first polyimide-based resin precursor film of Working Example 1 was 25%.

The first polyimide-based resin precursor film was coated to an intended dry film thickness with a varnish (polyimide amic acid varnish, polyamide-imide resin varnish, or polyamic acid varnish) shown in Table 7 and designed for the second polyimide-based resin layer, and the coated foil was dried at a temperature of 80 to 170° C. using a floating furnace, yielding a second polyimide-based resin precursor film.

The content of residual volatile fractions in the laminated film obtained by combining the first polyimide-based resin precursor film and second polyimide-based resin precursor film of Working Example 1 was 40%.

The second polyimide-based resin precursor film was coated to an intended dry film thickness with a varnish (polyimide amic acid varnish, polyamide-imide resin varnish, or polyamic acid varnish) of Table 7 for the third polyimide-based resin layer, and the coated foil was dried, yielding a third polyimide-based resin precursor film.

The content of residual volatile fractions in the laminated film obtained by combining the first polyimide-based resin precursor film, second polyimide-based resin precursor film, and third polyimide-based resin precursor film of Working Example 1 was 38%.

A laminate obtained by forming a laminated polyamide precursor film on metal foil in accordance with the above-described procedures was subsequently heat-treated in a continuous furnace at 230° C. The corresponding content of residual volatile fractions was 7.9%, and the imidation ratio, as measured by IR spectral analysis, was 20%. To perform an imidation treatment, the heat-treated laminate (100 m) was then wound on a stainless steel pipe having a diameter of 250 mm, with the metal foil facing inward, placed in a batch oven with a nitrogen gas atmosphere (oxygen concentration: 0.1% or less), heated to 350° C. over a period of 1 hour, and kept at 350° C. for 15 minutes. The temperature was then reduced to 200° C. in a nitrogen gas atmosphere, and the product was cooled in the atmosphere. A flexible board clad with metal foil on one side was thus obtained.

The laminated polyimide-based resin layers of the flexible boards in Working Examples 1 through 7 satisfied the relation $k_1>k_3>k_2$. The relation $k_1>k_3>k_2$ was also satisfied by Comparative Example 1, whereas the relation $k_3>k_1>k_2$ held true for Comparative Examples 2 and 3.

TABLE 7

| | | Laminated polyimide-based resin layer | | | | | | | | | |
|---|---|---|---|---|---|---|---|---|---|---|---|
| | | First layer | | | Second layer | | | Third layer | | | |
| Example | Foil | V | $k_1$ | $t_1$ | V | $k_2$ | $t_2$ | V | $k_3$ | $t_3$ | $t_1/t_3$ |
| Working Example | | | | | | | | | | | |
| 1 | Cu | A1 | 30 | 3 | C1 | 21 | 22 | C2 | 29 | 2 | 1.5 |
| 2 | Cu | A2 | 48 | 3 | C1 | 21 | 25 | C5 | 46 | 2 | 1.5 |
| 3 | Cu | B1 | 50 | 3 | C1 | 21 | 22 | C5 | 46 | 3 | 1.0 |
| 4 | Cu | B2 | 34 | 3 | C1 | 21 | 18 | A1 | 30 | 2 | 1.5 |
| 5 | Al | A2 | 48 | 2 | C6 | 23 | 25 | C5 | 46 | 2 | 1.0 |
| 6 | Al | A2 | 48 | 2 | C2 | 29 | 25 | C5 | 46 | 2 | 1.0 |
| 7 | SUS | A1 | 30 | 3 | C1 | 21 | 22 | C2 | 29 | 2 | 1.5 |
| Comparative Example | | | | | | | | | | | |
| 1 | Cu | A1 | 30 | 3 | C1 | 21 | 22 | C2 | 29 | 4 | 0.75 |
| 2 | Cu | C4 | 22 | 3 | C1 | 21 | 22 | C2 | 29 | 3 | 1.0 |
| 3 | Cu | A1 | 30 | 3 | C1 | 21 | 22 | C3 | 40 | 2 | 1.5 |

Notes of Table 7
V: type of varnish (reference example symbols are used)
$k_1$, $k_2$, $k_3$: coefficients of linear thermal expansion ($\times 10^{-6}$/K)
$t_1$, $t_2$, $t_3$: layer thicknesses ($\mu$m)
$t_1/t_3$: layer thickness ratio (Evaluation)

The curling properties, dimensional stability, and adhesive strength of the flexible boards In the working and comparative examples were studied as described below. In addition, the metal foil of the flexible boards was removed by etching to obtain laminated polyimide-based resin films, and the coefficients of linear thermal expansion of these films were measured.

The results of the above-described evaluation are shown in Tables 8 to 10.

Curling Properties

The flexible boards were cut 10 cm-square. The obtained flexible board samples of 10 cm square were placed on a smooth surface plate at normal temperature and an atmosphere temperature of 260° C., with the metal foil (metal foil pattern) facing up. The degree of curling (radius of curvature) was measured. In addition, the metal foil of the flexible boards was removed by etching to fabricate laminated polyimide-based resin films, and the coefficients of linear thermal expansion of these films were measured. The results are shown in Table 8.

The curling properties of the flexible boards and laminated polyimide-based resin films of Working Examples 1 through 7 were as follows. The flexible boards were measured in respect of a curvature radius to yield an infinite value (flat), the direction in which their end portions were slightly curved corresponded to a convexity on the metal side, and the laminated polyimide-based resin films were uncurled and had an infinitely large radius of curvature.

In Comparative Example 1, on the other hand, the laminated polyimide-based resin film was only slightly curved, but the curling of the flexible board was considerable, and the curling was directed such that a concavity formed on the metal side. In Comparative Examples 2 and 3, the curling of the flexible boards produced a convexity on the metal side and was so pronounced as to render the products unusable. The laminated polyimide-based resin films were noticeably curled inward into the third layer.

Dimensional Stability (Coefficient of Contraction)

The dimensional stability of flexible boards was measured according to the method described in JIS C 6471. Specifically, gauge marks of 210 mm square were provided to a flexible board, and the distance between the gauge marks ($L_{01}$, $L_{02}$) in the MD (flow) direction was measured. The metal foil was then removed by etching from the flexible board, the remaining laminated polyimide-based resin film was dried, and the distance between the gage points ($L_{11}$, $L_{12}$) was remeasured. In addition, a flexible board devoid of gauge points was heated to 280° C. over a period of 10 minutes without being etched. The heated board was allowed to cool, and the distance between the gage points ($L_{21}$, $L_{22}$) was measured. The results are shown in Table 9.

Evaluation Method

Dimensional stability (coefficient of contraction: %) following etching $$=\{(L_{11}-L_{01})/L_{01}+(L_{12}-L_{02})/L_{02}\}\times\tfrac{1}{2}\times 100$$

Dimensional stability (coefficient of contraction: %) following etching $$=\{(L_{21}-L_{01})/L_{01}+(L_{22}-L_{02})/L_{02}\}\times\tfrac{1}{2}\times 100$$

Adhesive Strength

The strength with which the external portion of a wound article, its middle portion, and its core adhered to the metal foil of a flexible board wound on a roll (roll diameter: about 200 mm) was measured according to the method described in JIS C 6471. Specifically, a flexible board was patterned to a width of 1.59 mm and peeled of in a 90-degree direction, and the force (kgf/cm) needed for such peeling was measured. The results are shown in Table 10.

In Table 10, "breakage" refers to cases in which a flexible board had high adhesive strength and broke without peeling. Total lack of adhesion is designated as "peeling."

TABLE 8

Curling properties (radius of curvature, mm)

| Example | Flexible board | | Laminated polyimide-based resin film | | Co-efficient of linear thermal expansion ($\times 10^{-6}$/K) |
|---|---|---|---|---|---|
| | Normal temperature | 260° C. | Normal temperature | 260° C. | |
| Working Example | | | | | |
| 1 | (flat) | (flat) | (flat) | (flat) | 24.0 |
| 2 | (flat) | (flat) | (flat) | (flat) | 25.0 |
| 3 | (flat) | (flat) | (flat) | (flat) | 25.8 |
| 4 | (flat) | (flat) | (flat) | (flat) | 25.0 |
| 5 | (flat) | (flat) | (flat) | (flat) | 26.5 |
| 6 | (flat) | (flat) | (flat) | (flat) | 27.5 |
| 7 | (flat) | (flat) | (flat) | (flat) | 24.5 |
| Comparative Example | | | | | |
| 1 | 50 mm (marked curling) | <10 mm (marked curling) | 500 mm (slight curling) | 500 mm (slight curling) | 24.5 |
| 2 | 50 mm (marked curling) | <10 mm (marked curling) | 70 mm (marked curling) | <10 mm (marked curling) | 23.5 |
| 3 | <10 mm (marked curling) | <10 mm (marked curling) | <10 mm (marked curling) | <10 mm (marked curling) | 27.5 |

TABLE 9

Dimensional stability of flexible board

| Example | Following etching | 280° C./10 min |
|---|---|---|
| Working Example | | |
| 1 | 0.005 | −0.045 |
| 2 | 0.008 | −0.072 |
| 3 | 0.007 | −0.070 |
| 4 | 0.0045 | −0.030 |
| 5 | 0.008 | −0.066 |
| 6 | 0.009 | −0.085 |
| 7 | 0.005 | −0.030 |
| Comparative Example | | |
| 1 | 0.007 | −0.060 |
| 2 | Unmeasurable due to considerable curling | Unmeasurable due to considerable curling |
| 3 | Unmeasurable due to considerable curling | Unmeasurable due to considerable curling |

TABLE 10

Adhesive strength (kgf/cm)

| Example | External portion of wound article | Middle portion | Core of wound article |
|---|---|---|---|
| Working Example | | | |
| 1 | Breakage | Breakage | Breakage |
| 2 | Breakage | Breakage | Breakage |
| 3 | Breakage | Breakage | Breakage |
| 4 | Breakage | Breakage | Breakage |
| 5 | Breakage | Breakage | Breakage |
| 6 | Breakage | Breakage | Breakage |
| 7 | Breakage | Breakage | Breakage |
| Comparative Example | | | |
| 1 | Peeling | Peeling | Peeling |
| 2 | 0.75 | Peeling | 0.50 |
| 3 | 0.75 | 0.80 | 0.60 |

The results in Tables 8 to 10 indicate that the flexible board of the present invention develops no or very little curling following metal foil patterning or imidation heat treatment. When slight curling does occur, this curling creates a situation in which a convexity is formed on the metal foil side. In addition, the flexible board and the laminated polyimide-based resin film per se have excellent dimensional stability. Excellent adhesive strength is also achieved. By contrast, the flexible boards of Comparative Example 1 to 3 develop pronounced curling. In addition, the dimensional stability and adhesive strength of these flexible boards and laminated polyimide-based resin films per se are inferior to those of the flexible boards of the examples.

The flexible board of the present invention develops no or very little curling following metal foil patterning or imidation heat treatment. When slight curling does occur, this curling creates a situation in which a convexity is formed on the metal foil side. Consequently, excellent dimensional stability (coefficient of contraction) is obtained, low-curling flexible wiring boards can be fabricated, and components can be mounted on the surface thereof with greater ease.

The entire disclosure of the specification, claims, summary and drawings of Japanese Patent application No. 10-363536 filed on Dec. 21, 1998 is herein incorporated by reference in its entirety.

What is claimed is:

1. A method of forming a flexible board, comprising:
    forming a first polyimide precursor film over a metal foil, the first polyimide precursor film having a content of residual volatile fractions within the range of 20 to 30 wt %;
    forming a second polyimide precursor film over the first polyimide precursor film, the second polyimide precursor film having a content of residual volatile fractions within the range of 30 to 50 wt %;
    forming a third polyimide precursor film over the second polyimide precursor film, the third polyimide precursor film having a content of residual volatile fractions within the range of 30 to 50 wt %; and
    heat treating the first polyimide precursor film, the second polyimide precursor film and the third polyimide precursor film at a temperature of 210° C. to 250° C. to set the content of residual volatile fractions of the first polyimide precursor film, the second polyimide precursor film and the third polyimide precursor film at 7 to 10 wt % and to bring the imidation ratio of the first polyimide precursor film, the second polyimide precursor film and the third polyimide precursor film to 50% or lower, to form a corresponding first polyimide-based layer, second polyimide-based layer and third polyimide-based layer, wherein said flexible board satisfies the equation $$k_1 > k_3 > k_2$$

where $k_1$ is the coefficient of linear thermal expansion of the first polyimide-based resin layer on the metal foil side, $k_2$ is the coefficient of linear thermal expansion of the second polyimide-based resin layer, and $k_3$ is the coefficient of linear thermal expansion of the third polyimide-based resin layer.

2. The method of forming a flexible board of claim 1, wherein the difference ($k_1-k_3$) in the coefficient of linear thermal expansion between the first polyimide-based resin layer and the third polyimide-based resin layer is $5 \times 10^{-6}$/K or less.

3. The method of forming a flexible board of claim 2, wherein the difference in the coefficient of linear thermal expansion between the second polyimide-based resin layer and the metal foil is within the range of $-5 \times 10^{-6}$/K to $+5 \times 10^{-6}$/K.

4. The method of forming a flexible board of claim 1, wherein the difference in the coefficient of linear thermal expansion between the second polyimide-based resin layer and the metal foil is within the range of $-5 \times 10^{-6}$/K to $+5 \times 10^{-6}$/K.

5. The method of forming a flexible board of claim 1, wherein the coefficient of linear thermal expansion of the entire laminated polyimide-based resin layer is in the range of $10 \times 10^{-6}$/K to $10 \times 10^{-6}$/K.

* * * * *